(12) United States Patent
Kim

(10) Patent No.: US 7,990,671 B2
(45) Date of Patent: *Aug. 2, 2011

(54) OVERVOLTAGE PROTECTION CONTROL CIRCUITS AND OVERVOLTAGE PROTECTION CONTROL METHODS

(75) Inventor: Dae-yong Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 218 days.

This patent is subject to a terminal disclaimer.

(21) Appl. No.: 11/727,975

(22) Filed: Mar. 29, 2007

(65) Prior Publication Data

US 2007/0230077 A1    Oct. 4, 2007

(30) Foreign Application Priority Data

Mar. 31, 2006  (KR) .................. 10-2006-0029815

(51) Int. Cl.
    *H02H 3/20*    (2006.01)
(52) U.S. Cl. ............... 361/91.1; 361/86; 361/88
(58) Field of Classification Search .......... 361/86, 361/88, 91.1, 91.2, 91.5
    See application file for complete search history.

(56) References Cited

U.S. PATENT DOCUMENTS

| | | | | |
|---|---|---|---|---|
| 4,787,007 A | * | 11/1988 | Matsumura et al. | 361/98 |
| 4,951,171 A | * | 8/1990 | Tran et al. | 361/90 |
| 5,214,316 A | * | 5/1993 | Nagai | 327/143 |
| 6,249,411 B1 | | 6/2001 | Hemena et al. | |
| 6,781,806 B2 | * | 8/2004 | Hashimoto et al. | 361/91.1 |
| 6,816,348 B2 | | 11/2004 | Chen et al. | |
| 7,030,668 B1 | * | 4/2006 | Edwards | 327/143 |
| 7,586,345 B2 | * | 9/2009 | Kim | 327/143 |
| 2004/0150929 A1 | * | 8/2004 | Strayer et al. | 361/91.1 |

FOREIGN PATENT DOCUMENTS

| | | |
|---|---|---|
| JP | 2001-156607 | 6/2001 |
| JP | 2004-364367 | 12/2004 |
| KR | 1020060067779 | 7/2005 |

OTHER PUBLICATIONS

Chinese Office Action dated Oct. 19, 2010 in corresponding Chinese Application No. 200710092205.7, with English translation.

* cited by examiner

*Primary Examiner* — Stephen W Jackson
*Assistant Examiner* — Terrence R Willoughby
(74) *Attorney, Agent, or Firm* — Harness, Dickey & Pierce, P.L.C.

(57) ABSTRACT

An overvoltage protection control circuit includes a voltage conversion circuit, a voltage comparison circuit, and a switching circuit. The voltage conversion circuit generates a first voltage and a second voltage based on a power supply voltage. The voltage comparison circuit generates a control signal based on a comparison between the first voltage and the second voltage. The switching circuit determines whether to apply the power supply voltage to a chip in response to the control signal. The overvoltage protection control circuit is formed inside the chip.

24 Claims, 4 Drawing Sheets

US 7,990,671 B2

OVERVOLTAGE PROTECTION CONTROL CIRCUITS AND OVERVOLTAGE PROTECTION CONTROL METHODS

PRIORITY STATEMENT

This non-provisional U.S. patent application claims priority under 35 U.S.C. §119 to Korean Patent Application No. 10-2006-0029815, filed on Mar. 31, 2006, in the Korean Intellectual Property Office (KIPO), the entire contents of which are incorporated herein by reference.

BACKGROUND

Description of the Conventional Art

Conventional overvoltage protection control circuits are used to suppress and/or prevent decreased reliability of digital circuits caused when a voltage greater than a certain threshold value is applied to the digital logic circuits inside chips. Conventionally, the reliability of the digital logic circuits may deteriorate when a voltage of about 6 V or more is applied. Hereinafter, voltage of about 6 V or more will be referred to as "overvoltage."

FIG. 1 is a schematic drawing showing a system including a conventional overvoltage protection control circuit. Referring to FIG. 1, an overvoltage protection control circuit 10 may determine overvoltage of a power supply voltage USB. When the power supply voltage is not at overvoltage, the overvoltage protection control circuit 10 may apply the power supply voltage to a system on chip (SOC) 20. A conventional overvoltage protection control circuit 10 formed of a chip separate from the SOC 20 may increase cost and/or size of a resultant system and/or chip. An overvoltage protection control circuit formed of a separate chip may also limit size reduction and/or integration of the system.

SUMMARY

Example embodiments relate to overvoltage protection control circuits, for example, an overvoltage protection control circuit including a BJT-diode and a resistance (or resistor) ladder in a system on chip (SOC) configuration for determining overvoltage. Example embodiments also relate to overvoltage protection control methods.

At least one example embodiment provides an overvoltage protection control circuit, which may reduce a unit price of a chip and/or the layout area of a system on chip (SOC). At least one other example embodiment provides an overvoltage protection control method, which may reduce a unit price of a chip and/or the layout area of an SOC.

At least one example embodiment provides an overvoltage protection control circuit including a voltage conversion circuit, a voltage comparison circuit and a switching circuit. The voltage conversion circuit may convert a power supply voltage into a first voltage and a second voltage. The voltage comparison circuit may generate a control signal by comparing the first voltage and the second voltage. The switching circuit may determine whether the power supply voltage is to be applied to a chip in response to the control signal.

According to at least some example embodiments, the voltage conversion circuit may be formed inside the chip, and may include a first voltage generator and a second voltage generator. The first voltage generator may convert the power supply voltage into the first voltage. The second voltage generator may convert the power supply voltage into the second voltage. The first voltage generator may include a plurality of BJT diodes corresponding to the level of the first voltage. According to at least one example embodiment, the first voltage generator may include two BJT diodes. The second voltage generator may include a plurality of resistors. For example, the second voltage generator may include a resistance ladder formed of two resistors connected in series. The second voltage generator may generate the second voltage by distributing the power supply voltage.

According to at least some example embodiments, the voltage comparison circuit may be formed inside the chip, and may include a comparator and an inverter. The comparator may output comparison results comparing the first and second voltages. The inverter may generate the control signal by inverting a logic level of the comparison results. The voltage comparison circuit may generate the control signal as logic low L when the second voltage is larger than the first voltage. The second voltage may be used as the operation power of the voltage comparison circuit.

According to at least some example embodiments, the switching circuit may include at least two transistors and a resistor. For example, the switching circuit may include an NMOS transistor, a resistor and a PMOS transistor. The control signal may serve as a gate voltage for at least one of the transistors (e.g., the NMOS transistor). The resistor may drop the power supply voltage by a desired amount. The desired dropped power supply voltage may serve as a gate voltage in the other of the at least two transistors (e.g., the PMOS transistor). The transistor having the desired dropped power supply voltage as a gate voltage (e.g., the PMOS transistor) may be turned off when the second voltage is larger than the first voltage.

At least one other example embodiment provides an overvoltage protection control method. According to at least this example embodiment, a power supply voltage may be converted into a first voltage, and the power supply voltage may be converted into a second voltage. The first voltage and the second voltage may be compared, and whether the power supply voltage is to be applied to a chip may be determined based on comparison results of the comparing of the first and second voltages.

According to at least some example embodiments, the power supply voltage may not be applied to the chip when the second voltage is determined to be larger than the first voltage. The converting of the power supply voltage into the first voltage may be performed by a plurality of BJT diodes corresponding to the level of the first voltage. The plurality of BJT diodes may be formed inside the chip. The converting of the power supply voltage into the second voltage may be performed by distributing the power supply voltage based on the ratio of a resistance ladder formed of two resistors connected in series. The resistance ladder may be formed inside the chip. According to at least some example embodiments, comparing of the first voltage and the second voltage may include generating comparison results after comparing the first and second voltages. The comparing of the first voltage and the second voltage may be performed using the second voltage as an operating voltage.

At least one other example embodiment provides an overvoltage protection control circuit. An overvoltage protection control circuit may include a voltage conversion circuit, a voltage comparison circuit and a switching circuit. The voltage conversion circuit may be configured to generate a first voltage and a second voltage based on a power supply voltage. The voltage comparison circuit may be configured to generate a control signal based on a comparison of the first voltage and the second voltage. The switching circuit may be configured to determine whether to apply the power supply voltage to a chip in response to the control signal.

According to at least some example embodiments, the second voltage generator may include a plurality of resistors and may be configured to generate the second voltage by distributing the power supply voltage. The first voltage generator may include a plurality of diodes configured to convert the power supply voltage into the first voltage. The voltage conversion circuit and the voltage comparison circuit may be formed on the chip.

At least one other example embodiment provides an overvoltage protection control method. According to at least this method, a first voltage and a second voltage may be generated based on a power supply voltage and the first voltage and the second voltage may be compared. Whether to apply the power supply voltage to a chip may be determined based on a result of the comparison of the first voltage and the second voltage.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS

Figure 1:
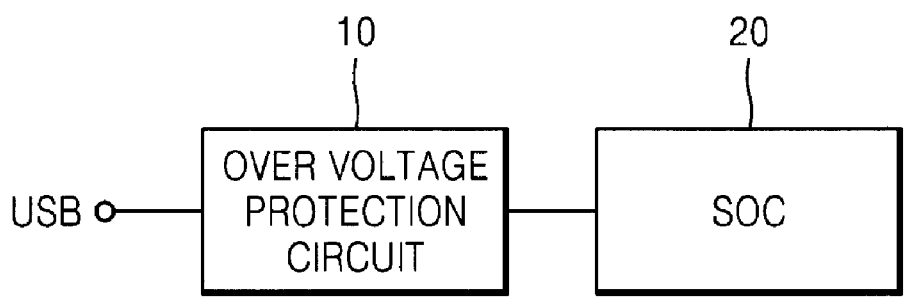
FIG. 1 is a schematic drawing of a system including a conventional overvoltage protection control circuit.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
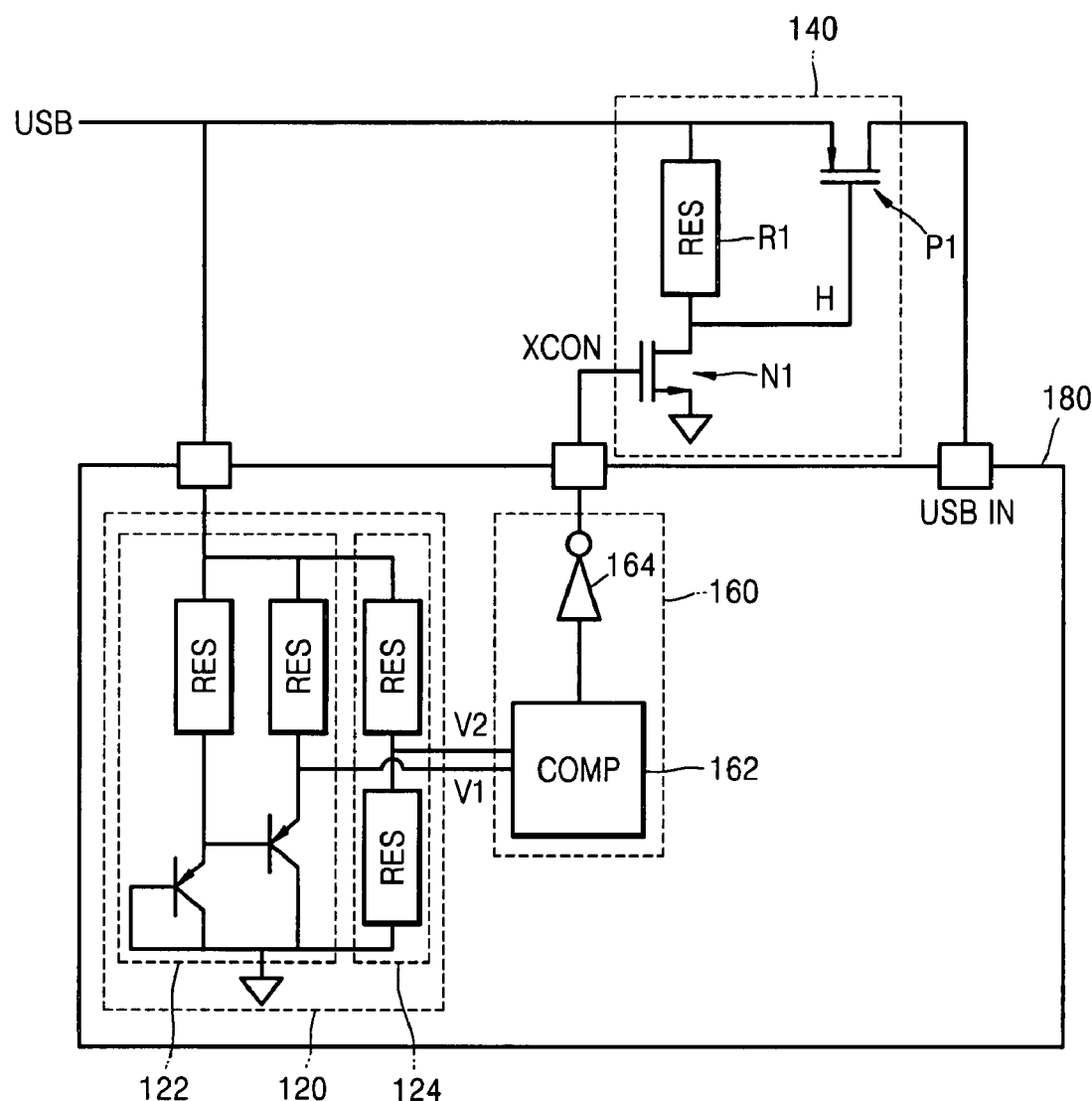
FIG. 2 is a drawing of an overvoltage protection control circuit according to an example embodiment.

FIG. 2 is a drawing of an overvoltage protection control circuit according to an example embodiment. Referring to FIG. 2, an overvoltage protection control circuit may include a voltage conversion unit 120, a voltage comparison unit 160 and a switching unit 140. The voltage conversion unit 120, a voltage comparison unit 160 and a switching unit 140 may also be referred to as a voltage conversion circuit 120, a voltage comparison circuit 160 and a switching circuit 140. However, for the sake of clarity, example embodiments will be discussed with regard to the voltage conversion unit 120, the voltage comparison unit 160 and the switching unit 140. The voltage conversion unit 120 may generate a first voltage V1 and a second voltage V2 based on a power supply voltage USB. In at least one example embodiment, the voltage conversion unit 120 may convert a power supply voltage USB into a first voltage V1 and a second voltage V2. The voltage conversion unit 120 may be formed inside a chip 180. In at least this example, the chip 180 may be a system on chip (SOC). The voltage conversion unit 120 may include a first voltage generator 122 and a second voltage generator 124.

Referring still to FIG. 2, the first voltage generator 122 may convert the power supply voltage USB into the first voltage V1. The first voltage generator 122 may include a plurality of bipolar junction transistor (BJT) diodes corresponding to the level of the first voltage V1. For example, the number of BJT diodes may correspond to a desired level of the first voltage V1. According to at least this example embodiment, as shown in FIG. 2, the first voltage generator 122 may include two resistors and two BJT diodes.

The second voltage generator 124 may convert the power supply voltage USB into the second voltage V2. The second voltage generator 124 may include a plurality of resistors. For example, in FIG. 2, the second voltage generator 124 may include a resistance ladder formed of two resistors connected in cascade or in series. The second voltage generator 124 may generate the second voltage V2 by distributing the power supply voltage USB.

In example operation, the power supply voltage USB, which may be less than or equal to about 15 V, may be applied to the inside of the chip 180 through a pad. Accordingly, the first and second voltage generators 122 and 124 inside the chip 180 may receive the power supply voltage USB.

Figure 3:
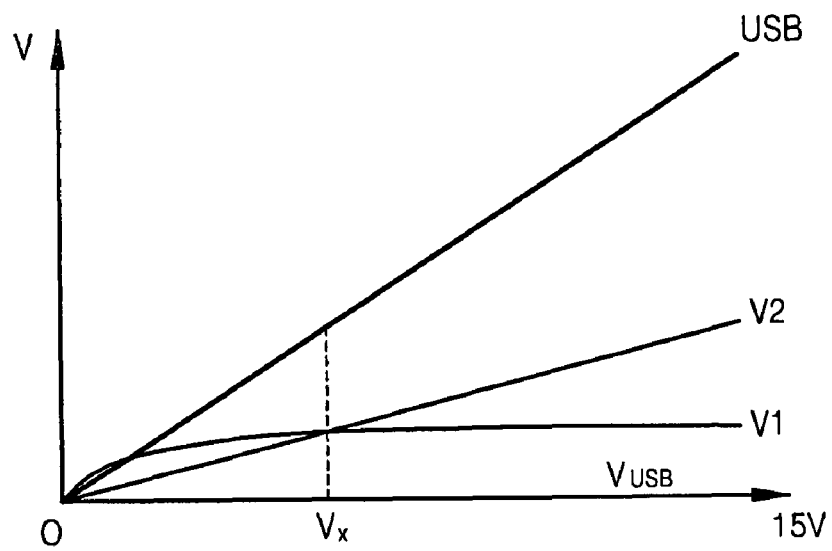
FIG. 3 is a graph showing the level of each voltage in the overvoltage protection control circuit of FIG. 2.

FIG. 3 is a graph showing the level of each voltage in the overvoltage protection control circuit of FIG. 2. Referring to FIGS. 2 and 3, the power supply voltage USB applied to the first and second voltage generators 122 and 124 may have a voltage level between about 0 V and about 15 V, inclusive. Based on properties of the BJT diode or diodes, the first voltage generator 122 may saturate the first voltage V1 with the power supply voltage USB when the power supply voltage USB is greater than or equal to a reference voltage Vx.

In this example, the saturated first voltage V1 may be regulated by the number of stacks of diodes. As shown in FIG. 2, the first voltage generator 122 may include two stacks of diodes. Accordingly, the saturated first voltage V1 may be about 1.4 V.

The second voltage generator 124 may generate the second voltage V2, wherein the slope of the second voltage V2 in FIG. 3 is determined by the ratio of the two resistors in series in the resistance ladder. In this example, the graphical representation of the first voltage V1 and the graphical representation of the second voltage V2 intersect when the power supply voltage USB is equal to the reference voltage Vx. For example, when the power supply voltage USB is less than the reference voltage Vx, the second voltage V2 may be smaller than the first voltage V1, and when the power supply voltage USB is greater than the reference voltage Vx, the second voltage V2 may be larger than the first voltage V1.

Because the first voltage V1 and the second voltage V2 may be determined by the number of diode stacks and the resistor ratio, respectively, the reference voltage Vx may be determined by regulating the number of diode stacks or the ratio of the resistance ladder. The reference voltage Vx may be about 6 V in order for the reference voltage Vx to determine overvoltage of the power supply voltage USB.

Referring again to FIG. 2, the voltage comparison unit 160 may compare the first voltage V1 and the second voltage V2 to generate a control signal XCON. The voltage comparison unit 160 may also be formed inside the chip 180. For example, the voltage conversion unit 120 and the voltage comparison 160 may be co-located on a single chip, such as, an SOC.

The voltage comparison unit 160 may include a comparator 162 and an inverter 164. The comparator 162 may receive and compare the first and second voltages V1 and V2, and output one or more results (e.g., comparison results) based on the comparison.

When the second voltage V2 is larger than the first voltage V1, (e.g., when the power supply voltage USB is greater than the reference voltage Vx), the comparator 162 may output a comparison results having a logic high H. On the other hand, when the second voltage V2 is smaller than the first voltage V1 (e.g., when the power supply voltage USB is less than the reference voltage Vx), the comparator 162 may output a comparison result having a logic low L.

The inverter 164 may invert the logic level of the comparison results to generate the control signal XCON. Accordingly, when the power supply voltage USB is at overvoltage (e.g., when the power supply voltage USB is higher than the reference voltage Vx), the control signal XCON may be generated as a logic low L.

In this example, the voltage comparison unit 160 may use the second voltage V2 as a power supply voltage. The second voltage V2 may be used for the operation power of the voltage comparison unit 160 because the analog comparator 162 need only output a high or low logic level. For example, because the comparator 162 need not perform higher or relatively high speed operations, the comparator 162 may not be affected by a change in the operational power supply voltage.

When the second voltage V2 is used as the operation power of the voltage comparison unit 160, a separate power supply may not be required to operate the voltage comparison unit 160. Accordingly, an internal pressure issue may be suppressed and/or prevented.

Referring to FIG. 2, the switching unit 140 may determine whether the power supply voltage USB is to be applied to a chip in response to the control signal XCON. According to at least this example embodiment, the switching unit 140 may be formed outside the chip 180, and separate from the voltage conversion unit 120 and the voltage comparison unit 160. The switching unit 140 may be formed of devices which may be prepared using, for example, a special FET process, and thus, may not be integrated inside the chip 180.

The switching unit 140 may include a first transistor N1, a resistor R1, and a second transistor P1. According to at least this example embodiment, the first transistor N1 may be an NMOS transistor, and the second transistor P1 may be a PMOS transistor; however, any suitable transistor or switching device may be used. The first transistor N1 may utilize the control signal XCON as a gate voltage. Thus, when the power supply voltage USB is not at overvoltage, (e.g., when the control signal XCON is applied as logic high H), the first transistor N1 may be turned on.

When the first transistor N1 is turned on, current flows to the resistor R1, and the resistor R1 may reduce the power supply voltage USB by a desired, particular or specific amount. The resistor R1 may have a resistance between about 10 and about 100 KΩ, inclusive.

In the second transistor P1, the reduced power supply voltage USB may be utilized as a gate voltage. Accordingly, the second transistor P1 may be turned on. When the second transistor P1 is turned on, the power supply voltage USB may be applied to a digital logic circuit in the chip 180. However, when the power supply voltage USB is at overvoltage (e.g., when the control signal XCON is applied as logic low L), the first transistor N1 may be turned off. When the first transistor N1 is turned off, a current cannot flow to the resistor R1. Accordingly, the second transistor P1 may be turned off. When the second transistor P1 is turned off, the power supply voltage USB may not be applied to the digital logic circuit in the chip 180.

Figure 4:
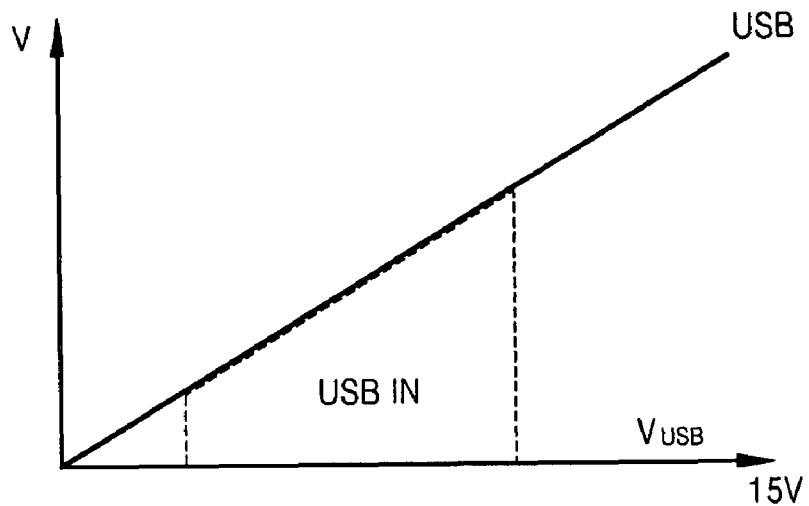
FIG. 4 is a graph showing the range of voltage applied to a chip by the overvoltage protection control circuit of FIG. 2.

FIG. 4 is a graph showing the range of voltage applied to the chip 180 by the overvoltage protection control circuit of FIG. 2. Referring to FIG. 4, the overvoltage protection control circuit of FIG. 2 may apply a voltage to the chip 180 in a range, which may not affect the reliability of a device. For example, in the overvoltage protection control circuit according to at least this example embodiment, even when a relatively high voltage is applied to the chip 180, power supply voltage USB may be reduced by regulating the number of BJT diode stacks or the ratio of the resistance ladder.

Figure 5:
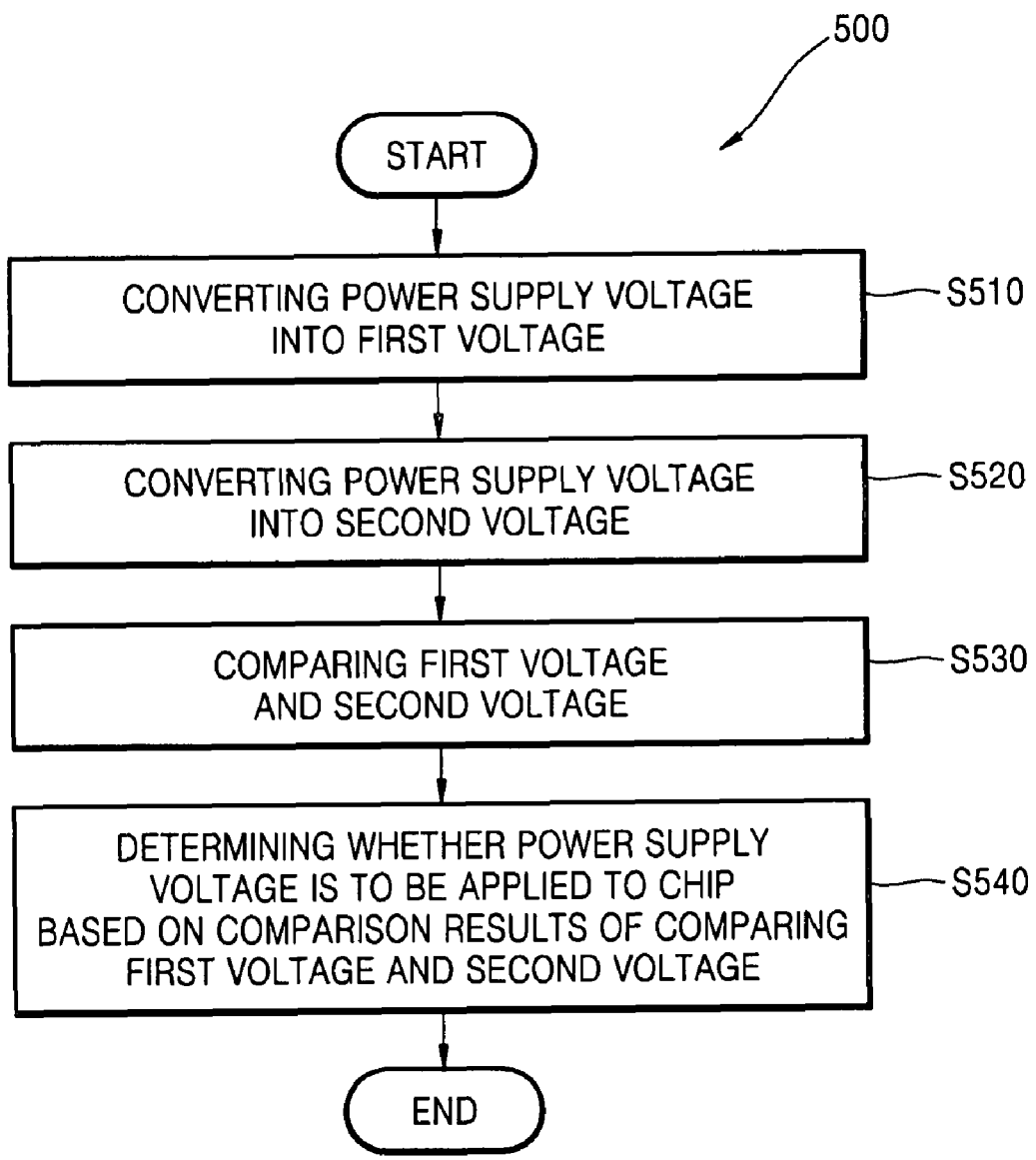
FIG. 5 is a flowchart illustrating an overvoltage protection control method according to an example embodiment.

FIG. 5 is a flowchart illustrating an overvoltage protection control method 500 according to an example embodiment. Referring to FIG. 5, in the overvoltage protection control method 500, a power supply voltage may be converted into a first voltage at S510, and the power supply voltage may be converted into a second voltage at S520. The first voltage and the second voltage may be compared at S530, and whether to apply the power supply voltage to a chip may be determined based on the result (e.g., comparison result) of the comparison between the first and second voltages at S540.

In the determining whether to apply the power supply voltage to the chip at S540, when the second voltage is larger than the first voltage, the power supply voltage may not be applied to the chip. The overvoltage protection control method according to at least this example embodiment may be performed, and thus, operate in the same or substantially the same manner as the overvoltage protection control circuit described above with regard to FIG. 2. Accordingly, a detailed description of the overvoltage protection control method will be omitted for the sake of brevity.

By utilizing example embodiments, the overvoltage protection control circuit may be formed inside the chip, which may reduce a unit price and/or a size (e.g., chip layout area) of the chip.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. An overvoltage protection control circuit, comprising:
    a voltage conversion circuit configured to generate a first voltage and a second voltage based on a power supply voltage;
    a voltage comparison circuit configured to generate a control signal based on a comparison of the first voltage and the second voltage; and
    a switching circuit configured to determine whether to apply the power supply voltage to a chip in response to the control signal;
    wherein at least one of the voltage conversion circuit and the voltage comparison circuit is part of the chip,
    wherein the power supply voltage is applied to the chip that includes the at least one of the voltage conversion circuit and the voltage comparison circuit,
    wherein the switching circuit includes:
        a first transistor receiving the control signal as a gate voltage;
        a resistor configured to reduce the power supply voltage by a first amount; and
        a second transistor receiving the reduced power supply voltage as a gate voltage.

2. The overvoltage protection control circuit of claim 1, wherein the voltage conversion circuit is part of the chip.

3. The overvoltage protection control circuit of claim 1, wherein the voltage conversion circuit includes:
    a first voltage generator configured to convert the power supply voltage into the first voltage; and
    a second voltage generator configured to convert the power supply voltage into the second voltage.

4. The overvoltage protection control circuit of claim 3, wherein the second voltage generator includes:
    a plurality of resistors;
    wherein the second voltage generator is configured to convert the power supply voltage into the second voltage by distributing the power supply voltage.

5. The overvoltage protection control circuit of claim 4, wherein the plurality of resistors includes at least two resistors connected in series.

6. The overvoltage protection control circuit of claim 3, wherein the first voltage generator includes:
    a plurality of diodes configured to convert the power supply voltage into the first voltage.

7. The overvoltage protection control circuit of claim 3, wherein the first voltage generator includes:
    two diodes configured to convert the power supply voltage into the first voltage.

8. The overvoltage protection control circuit of claim 1, wherein the voltage comparison circuit is part of the chip.

9. The overvoltage protection control circuit of claim 1, wherein the voltage comparison circuit includes:
    a comparator configured to output a comparison result based on a comparison of the first and second voltages; and
    an inverter configured to generate the control signal by inverting a logic level of the comparison result.

10. The overvoltage protection control circuit of claim 1, wherein the voltage comparison circuit is configured to generate a logic low L as the control signal when the second voltage is greater than the first voltage.

11. The overvoltage protection control circuit of claim 1, wherein the second voltage is used as operating power of the voltage comparison circuit.

12. The overvoltage protection control circuit of claim 1, wherein the second transistor is turned off when the second voltage is greater than the first voltage.

13. The overvoltage protection control circuit of claim 1, wherein the chip is a system on chip (SOC).

14. The overvoltage protection control circuit of claim 1, wherein the voltage conversion circuit and the voltage comparison circuit are part of the chip.

15. An overvoltage protection control method, comprising:
    generating a first voltage and a second voltage based on a power supply voltage;
    comparing the first voltage and the second voltage;
    generating a control signal based on comparing the first voltage and the second voltage; and
    determining whether to apply the power supply voltage to a chip in response to the control signal;
    wherein the generating of the first voltage is performed by a plurality of diodes,
    wherein the generating of the second voltage is performed by distributing the power supply voltage based on a ratio of a resistance ladder formed of at least two resistors connected in series,
    wherein at least one of the plurality of diodes and the resistance ladder is part of the chip,
    wherein the power supply voltage is applied to the chip that includes the at least one of the plurality of diodes and the resistance ladder, and
    wherein determining whether to apply the power supply voltage to the chip includes:
        providing the control signal as a gate voltage to a first transistor;
        reducing the power supply voltage by a first amount using a resistor; and
        providing the reduced power supply voltage as a gate voltage to a second transistor.

16. The overvoltage protection control method of claim 15, wherein the power supply voltage is not applied to the chip when the second voltage is greater than the first voltage.

17. The overvoltage protection control method of claim 15, wherein the plurality of diodes are part of the chip.

18. The overvoltage protection control method of claim 15, wherein the resistance ladder is part of the chip.

19. The overvoltage protection control method of claim 15, wherein the comparing of the first voltage and the second voltage is performed using the second voltage as an operating voltage.

20. The overvoltage protection control method of claim 15, wherein the chip is a system on chip (SOC).

21. An overvoltage protection control circuit, comprising:
- a voltage conversion circuit configured to generate a first voltage and a second voltage based on a power supply voltage;
- a voltage comparison circuit configured to generate a control signal based on a comparison of the first voltage and the second voltage; and
- a switching circuit configured to determine whether to apply the power supply voltage to a chip in response to the control signal;
- wherein at least one of the voltage conversion circuit and the voltage comparison circuit is part of the chip,
- wherein the power supply voltage is applied to the chip that includes the at least one of the voltage conversion circuit and the voltage comparison circuit,
- wherein when the first voltage is greater than the second voltage, the switching circuit applies the power supply voltage to the chip, and
- wherein when the second voltage is greater than the first voltage, the switching circuit prevents the power supply voltage from being applied to the chip.

22. The overvoltage protection control circuit of claim 21, wherein the voltage conversion circuit is part of the chip.

23. The overvoltage protection control circuit of claim 21, wherein the voltage comparison circuit is part of the chip.

24. The overvoltage protection control circuit of claim 21, wherein the voltage conversion circuit and the voltage comparison circuit are part of the chip.

* * * * *